US007016346B1

(12) United States Patent
Alowersson et al.

(10) Patent No.: US 7,016,346 B1
(45) Date of Patent: Mar. 21, 2006

(54) APPARATUS AND METHOD FOR CONVERTING DATA IN SERIAL FORMAT TO PARALLEL FORMAT AND VICE VERSA

(75) Inventors: Jonas Alowersson, Malmö (SE); Bertil Roslund, Lund (SE); Patrik Sundström, Osby (SE)

(73) Assignee: SwitchCore A.B., Lund (SE)

( * ) Notice: Subject to any disclaimer, the term of this patent is extended or adjusted under 35 U.S.C. 154(b) by 0 days.

(21) Appl. No.: 09/469,979

(22) Filed: Dec. 21, 1999

(30) Foreign Application Priority Data

Dec. 22, 1998 (SE) .............................................. 9804479

(51) Int. Cl.
*H04L 12/50* (2006.01)

(52) U.S. Cl. ................... 370/363; 370/366; 365/230.05

(58) Field of Classification Search ................. 370/362, 370/363, 368, 366, 384, 365, 412, 428; 365/190, 365/191, 189.01–189.05, 189.07, 189.08, 365/189.12, 194, 220, 221, 219, 130, 238, 365/230.01–230.05, 230.08, 230.09
See application file for complete search history.

(56) References Cited

U.S. PATENT DOCUMENTS

| | | | | |
|---|---|---|---|---|
| 4,610,004 A | * | 9/1986 | Moller et al. | 365/230.05 |
| 4,719,601 A | | 1/1988 | Gray et al. | |
| 4,720,819 A | * | 1/1988 | Pinkham et al. | 365/219 |
| 4,736,361 A | * | 4/1988 | Cooperman et al. | 370/384 |
| 4,924,464 A | | 5/1990 | Baylock | |
| 5,101,202 A | | 3/1992 | Chaisemartin et al. | |
| 5,136,587 A | | 8/1992 | Obana et al. | |
| 5,157,775 A | | 10/1992 | Sanger | |
| 5,212,686 A | | 5/1993 | Joy et al. | |
| RE34,305 E | | 7/1993 | Sakurai et al. | |
| 5,303,200 A | * | 4/1994 | Elrod et al. | 365/238 |
| 5,463,630 A | | 10/1995 | Tooher | |
| 5,475,680 A | | 12/1995 | Turner | |

FOREIGN PATENT DOCUMENTS

| | | |
|---|---|---|
| DE | 3922482 A1 | 7/1989 |
| JP | 57-117582 | 7/1982 |
| JP | 60-180338 A | 2/1984 |
| JP | 59-008428 | 9/1984 |
| JP | 60-180338 | 9/1985 |
| WO | 95/02951 | 1/1995 |
| WO | WO 95/02951 | 1/1995 |
| WO | WO 97/31316 | 8/1997 |

* cited by examiner

*Primary Examiner*—Steven Nguyen
*Assistant Examiner*—Phuongchau Ba Nguyen
(74) *Attorney, Agent, or Firm*—Coudert Brothers LLP

(57) ABSTRACT

Converters and a corresponding method for converting serial data to parallel format and vice versa, particularly for use in switches for telecommunications applications. The converters comprise a storage element associated with each serial channel and comprising two arrays of storage elements. At any one time, the storage elements are accessed sequentially while those of the other array are accessed in parallel. A data bus, divided into portions by buffers, connects the by buffers, connects the serial channel to all storage cells in an associated storage element. For serial to parallel conversion, the buffers latch data from one bus portion to the next in accordance with a write cycle during which one storage element is written. Writing commences from the bus portion furthest from the incoming serial channel and storage elements on either side of a buffer are written simultaneously. The resulting delay between writing arrays words allows checking of the data such as synchronization.

35 Claims, 4 Drawing Sheets

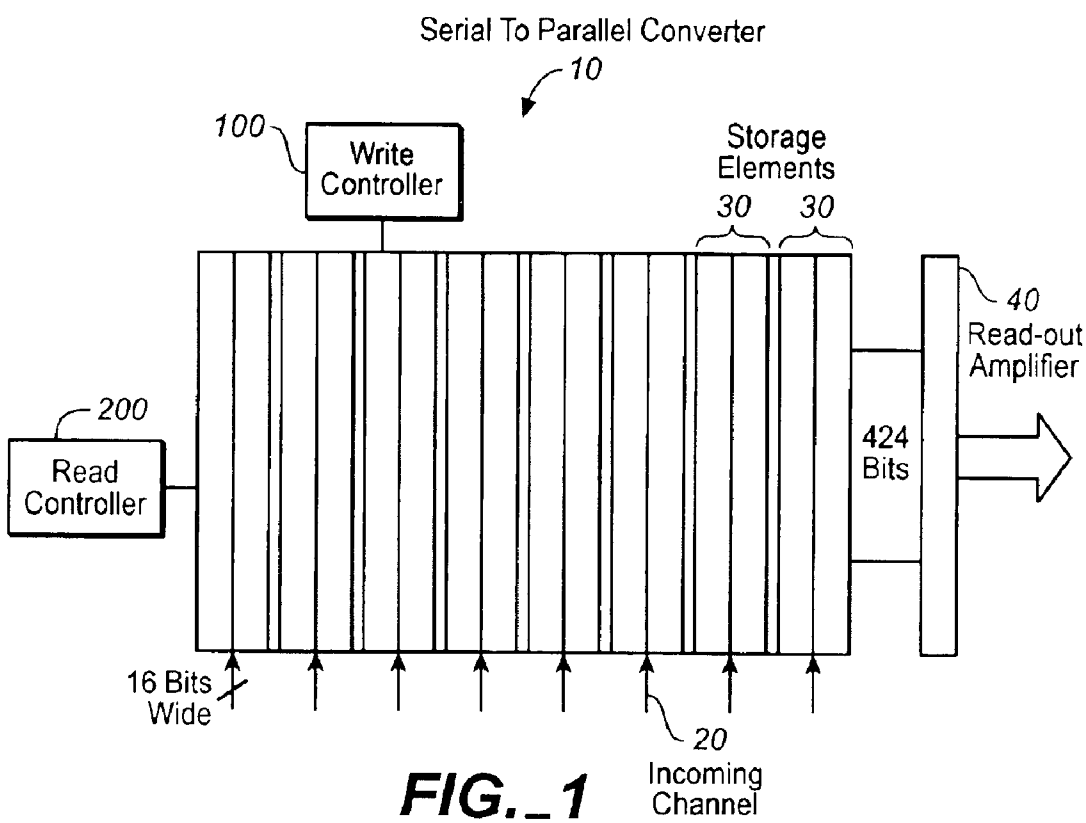
FIG._1

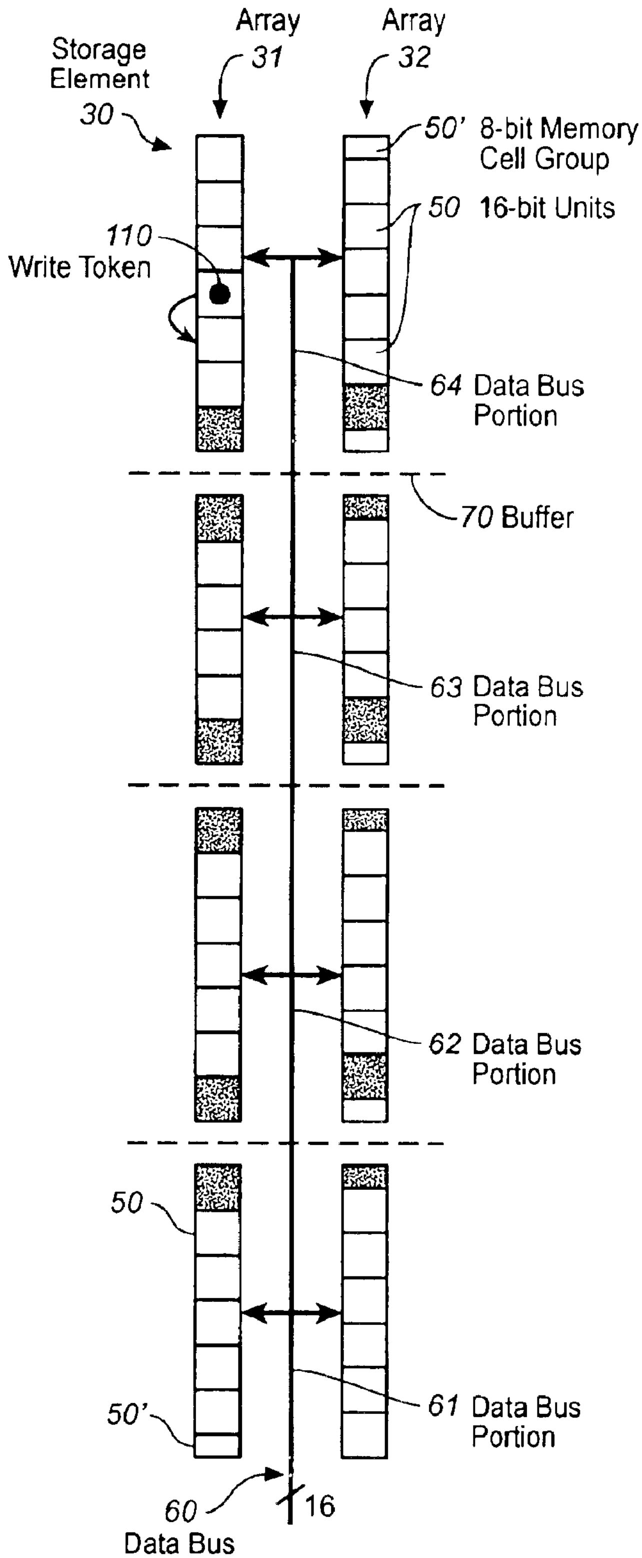
FIG._2

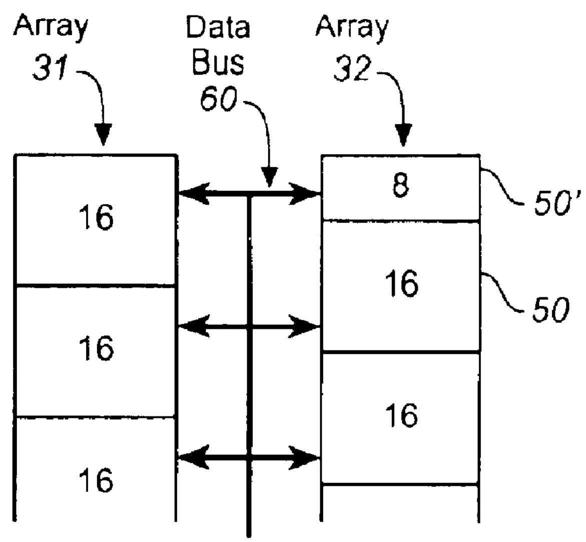
FIG._3
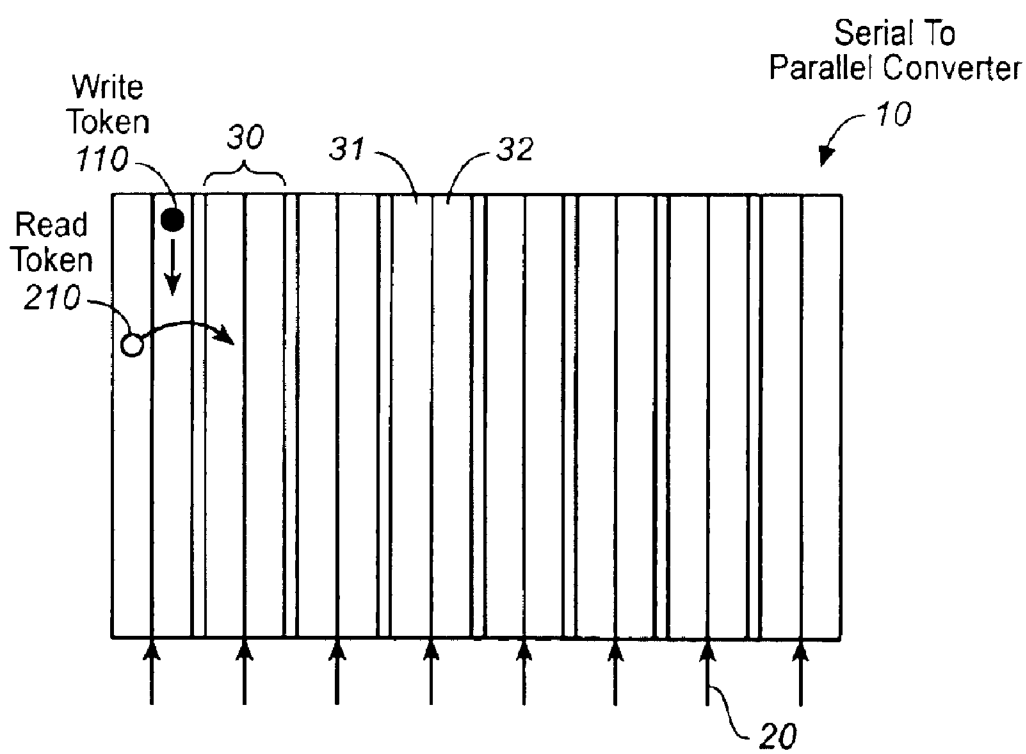
FIG._4

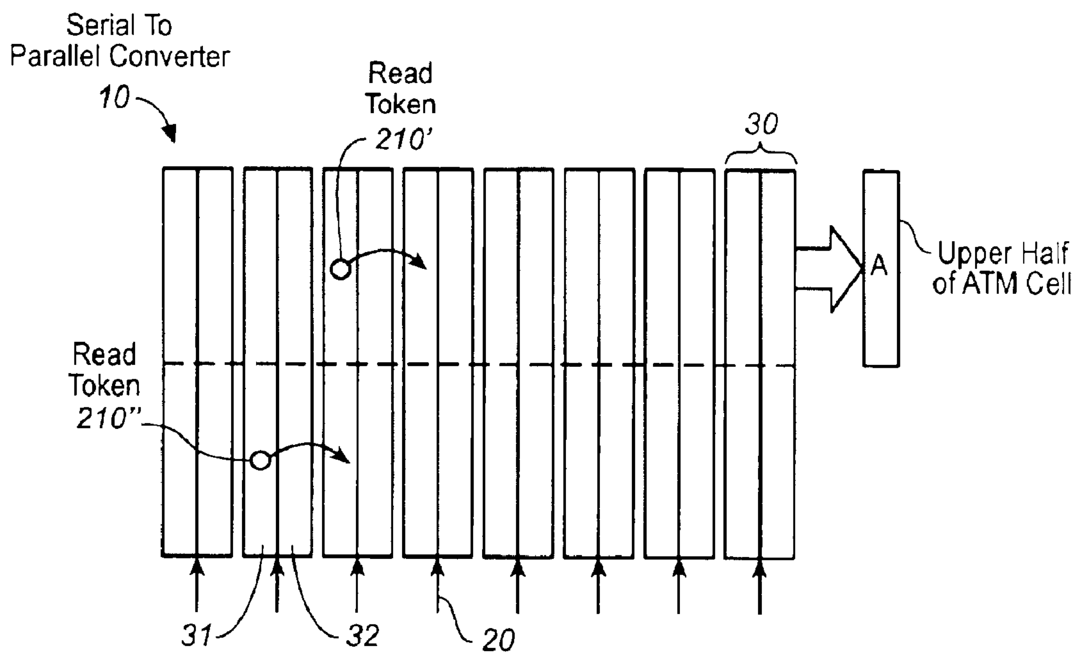
FIG._5
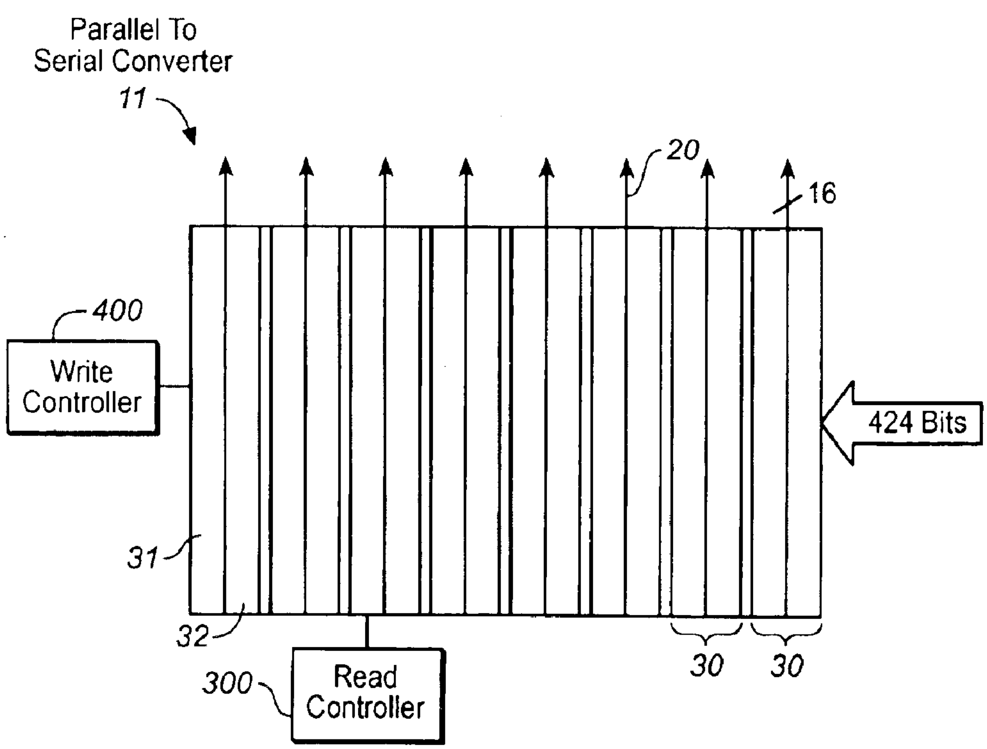
FIG._6

APPARATUS AND METHOD FOR CONVERTING DATA IN SERIAL FORMAT TO PARALLEL FORMAT AND VICE VERSA

FIELD OF INVENTION

The invention is directed to converters for converting serial data stream to a parallel format and vice versa, particularly for use in switching systems for telecommunications applications capable of handling both synchronous and asynchronous data streams, and for multiplexing, demultiplexing and synchronising multiple information streams. The invention further relates to methods for operating these converters.

BACKGROUND ART

Of the many applications for serial to parallel and parallel to serial converters their utilisation in telecommunication switches is of ever increasing interest due to the growth in traffic and the need to provide adequate capacity for the diversity of links in demand.

Telecommunication switches switch between logical channels capable of carrying serialised data and conventionally comprise a number of serial input and output channels. They often also incorporate serial to parallel conversion for enabling parallel processing and routing of the payload data, followed by reconversion of the parallel data to serial data streams while routing these onto the correct output channels.

Examples of a serial to parallel converter and a parallel to serial converter are described in U.S. Pat. No. 5,475,680 to Turner for use in an asynchronous time division multiplexed (ATDM) switching system. In the serial to parallel converter, half the data packets from each incoming serial channel are buffered in one of two shift registers. Data is shifted into each of the shift registers synchronously. This is made possible by disposing a phase aligner upstream of the converter to align the incoming packets. Once the first of these registers is full, the second half of the data packet is read into the second shift register and, at the same time, data is read out in parallel from the first shift registers of each channel in sequence. The two packet halves are subsequently stored separately while being processed. The resulting arrangement is relatively complex both in terms of its structure and its operation control.

A further form of serial to parallel converter described in U.S. Pat. No. 5,463,630 to Tooher and used for time division multiplexing and demultiplexing serial data streams utilises a structure of dual port random access memory (RAM) cells. One such structure dimensioned to hold one 64-bit data word is associated with each serial channel. Serial access to the structure is obtained via a shift register or by sequentially addressing the RAM cells. In the serial to parallel converter a serial driver is disposed between the incoming channel and the structure. A disadvantage of this arrangement is that the relative timing between input and output of storage structure is very complicated, and in the worst case may preclude a serial to parallel converter from being used at full capacity. This overall arrangement is also of a relatively complex structure and is inflexible in terms of the possible application of the converters.

It is accordingly an object of the present invention to overcome the disadvantages of prior art arrangements.

It is a further object of the present invention to provide serial to parallel converters and parallel to serial converters that are of simple structure and are flexible in terms of configuration, enabling their utilisation in a variety of applications.

SUMMARY OF INVENTION

The above objects are achieved in an apparatus for converting data in serial format into parallel format and data in parallel format into serial format, comprising at least one serial data channel, a storage element associated with each serial data channel and having at least first and second arrays of storage cells with first and second ports, wherein the first ports of all storage cells of a storage element are connected in parallel to a data bus interconnecting the storage element with the associated channel, the data bus comprising at least one buffering element arranged to separate said data bus into portions, each portion being connected to the first port of at least one storage cell of each array of said storage element, and wherein means are provided for enabling the transfer of data between said bus and at least one storage cell in said storage element via said first port and enabling the transfer of data from one bus portion to an adjacent bus portion via said at least one buffering element.

The invention further resides in a method for converting serial data to a parallel format utilising the above apparatus, including transmitting serial data from each channel onto the associated data bus and enabling the sequential input of data from the data bus into the memory cells of one array of each storage element in accordance with a write cycle.

In accordance with a further aspect of the invention, the above objects are achieved in a method for converting parallel data to a serial format utilising the above-defined apparatus, the method including enabling the sequential output of data from the memory cells of one array of each storage element onto the data bus in accordance with a read cycle and transmitting serial data from each data bus onto the associated channel.

By means of the above arrangement and methods according to the invention both serial to parallel and parallel to serial conversion is possible with a simple structure. Furthermore, parallel data is always accessible, in that it may always be read out of the storage element in a serial to parallel converter or written into a storage element in the parallel to serial converter. The use of buffering elements in the data bus, while allowing the accommodation of relatively large data structures also enables the introduction of delays between the reading or writing of successive serial data packets allowing the synchronisation of non-synchronised channels.

The invention further resides in a communications switch for switching voice or data traffic comprising an apparatus as defined above and operating in accordance with the above methods.

BRIEF DESCRIPTION OF THE DRAWINGS

Further objects and advantages of the present invention will become apparent from the following description of the preferred embodiments that are given by way of example with reference to the accompanying drawings, in which:

FIG. 1 schematically depicts the structure of a serial to parallel converter according to the invention, FIG. 2 shows the structure of a single storage element of the serial to parallel converter of FIG. 1, FIG. 3 schematically shows a detail of part of a storage element of FIG. 2, FIG. 4 schematically illustrates the reading scheme of the serial to parallel converter of FIG. 1, FIG. 5 schematically illustrates a further reading scheme of the serial to parallel converter of FIG. 1, and FIG. 6 schematically shows the structure of a parallel to serial converter according to the invention.

DETAILED DESCRIPTION OF THE DRAWINGS

FIG. 1 schematically shows a serial to parallel converter 10 for converting serial data from eight channels 20 to a parallel data stream. In the exemplary embodiment, the converter is part of a telecommunications switch for switching asynchronous serial data (ATM). The remaining parts of the switch are not shown in the drawings. Each channel 20 transmits information formatted into ATM cells and the converter serves to multiplex the incoming signals into a parallel data stream prior to switching the ATM cells to the designated output channels. In the present embodiment, the channels 20 are actually 16-bits wide, but the input is nonetheless considered as serial relative to the output of the converter 10. The term 'serial' is intended to incorporate this meaning throughout this document. The parallel output stream emitted by the converter 10 is equal in dimension to an ATM cell in the present embodiment. ATM cells comprise 53 octets or 424 bits of information; the converter thus converts 8 16-bit input data streams to a parallel data stream that is 424 bits wide.

The serial to parallel converter comprises a number of temporary storage elements 30, one associated with each incoming channel 20. The storage elements 30 are connected in parallel to a read-out amplifier 40, which emits a 424-bit data stream. The converter 10 also includes a write controller 100 for controlling the input of serial data into the storage elements 30 and a read controller 200 for controlling the reading of parallel data out of the storage elements 30.

FIG. 2 illustrates the structure of each storage element 30 in more detail. In the preferred embodiment each storage element comprises two arrays 31, 32 of memory cells that are organised into groups 50, 50'. The 1-bit memory cells in each group are written and read simultaneously, as will be described below.

Each array 31, 32 is dimensioned to store a complete ATM cell, that is 424 bits. In the present embodiment, the majority of the memory cells are grouped into 16-bit units 50 to enable the simultaneous input of 16 bits from the data bus 60. However since an ATM cell comprises an uneven number of octets, one memory cell group in each arrays 31, 32, denoted by 50, will hold only 8 bits, i.e. comprise 8 1-bit memory cells. The arrays 31, 32 are filled, respectively, from top to bottom. For this reason their structures are not identical. Specifically the first array, 31 ends with an 8-bit memory cell group 50' while the second array begins with an 8-bit memory cell group. Since the ATM cells are transmitted on 16-bit channels, the final 8 bits of a first ATM cell may arrive in parallel with the first 8 bits of the following cell. Accordingly, the last 8-bit cell group 50 of array 31 will receive the final bits of the first ATM cell while 8 start bits of the following ATM cell will be stored in the topmost cell group 50 of the second array 32. The 8-bit memory cell groups 50 are considered equivalent to the 16-bit memory cell groups 50 for the purposes of reading and writing the arrays 31, 32. Accordingly, the converter 10 can be considered to comprise 16 columns and 27 rows of memory cell groups 50, 50'.

The 1-bit memory cells making up the groups 50, 50' typically comprise random access memory (RAM) cells and preferably static RAM (SRAM) cells. The RAM cells are also preferably dual port memories having separate input and output (or read and write) ports.

The incoming serial channels 20, which are not shown in FIG. 2, are each connected to a respective data bus 60. The data bus 60 is adapted to the size of the serial channel and, in the present example, carries a 16-bit data stream. The data bus is connected in parallel to the input, or write ports of all RAM cells in both arrays 31, 32 (see FIG. 3) of the storage element 30 associated with the incoming channel 20. The output ports of all memory cells in one row, i.e. of 16 memory cells across the whole converter shown in FIG. 1, are connected in parallel to the read-out amplifier 40.

Due to the size of the storage elements 30, some form of driver must be provided in the data buses. This is achieved by arranging 3 16-bit buffers 70 at intervals along the length of each data bus. These buffers 70 are indicated in FIG. 2 by dashed lines. The buffers 70 effectively divide the data bus 60 into several portions, four, 61, 62, 63, and 64, in the present embodiment. This effectively divides up the storage elements 30 correspondingly, with the memory cell groups 50, 50 in different sections being accessible via portions 61, 62, 63, 64, of the data bus. The buffers 70 latch data from an upstream data bus portion to the succeeding data bus portion under control of the write controller 100. The buffers 70 are typically pipeline registers and, for example, comprise simple flip-flop elements adapted to latch a 16-bit data word onto the next data bus portion.

As a result of the described structure, each storage element functions as a double ATM cell buffer, whereby one array 31, 32 can be written with data from the data bus 60, while parallel data is read from the other array.

Writing of data from each data bus 60 into the corresponding storage element 30 is controlled by the write controller 100. Since data will be presented to all the memory cells of a storage element 30 simultaneously, the write controller 100 serves to designate which group of memory cells 50, 50' is to be written into, i.e. which group of input ports enabled. This is illustrated schematically by a write token 110 shown in FIG. 2. The circulation of the write token represents the order in which individual groups of memory cells 50, 50 are addressed.

The write controller 100 defines a write cycle, during which data is written to one group of memory cells 50, 50'. The write cycle is determined by an input clock that may be generated by the write controller 100 or by a separate clock generator that is not shown. The write clock rate is selected to correspond to the bit rate of the incoming channel 20. For example, for an incoming bit rate of 10 Gbit/s an input clock rate of 622 MHz would be appropriate. The position of the write token 110 indicates which group of memory cells 50, 50' will be written during this write cycle. On terminating a write cycle, the write token 110 is moved from one group of memory cells 50, 50' to the next. The buffers 70 are also controlled to latch data onto the next bus portion once during this write cycle. This buffering consequently introduces a delay of one write cycle as the data passes from one bus portion 61, 62, 63, 64, to the next.

Writing initially begins at the top of the first array 31, i.e. at the uppermost of the memory cell groups 50 accessed via the portion of the data bus 64 which is furthest from the incoming channel 20. There is thus a delay of 3 write cycles before the first 16 bits of the incoming ATM cell are written into the storage element 30. The write token 110 is likewise delayed by the write controller 100 by three cycles before being placed in the top memory cell group 50 to indicate that writing is enabled.

With each successive cycle, the write token moves down one group of memory cells 50. However, when the write token reaches the last group of memory cells 50 in this uppermost bus portion 64, the next 16 bits of data will already have been latched onto the bus portion 63 located directly upstream. To prevent loss of data, the group of memory cells 50 directly below the buffer 70 must be written at the same time as the group located directly above it. This is represented in FIG. 2 by the shaded memory cell groups 50. This is true for every interface between bus portions 61, 62, 63, 64. Accordingly, a write token 110 is placed in each of the two groups of memory cells 50 adjacent a buffer line 70 during the same write cycle. The actual writing of a complete ATM cell to the memory cells in one array 31 is therefore compressed by three write cycles. The compression in writing and the delay prior to inputting the first bits of an ATM cell into an array 31, 32, both of which result from the use of the buffering elements 70, means that three write cycles are available between the writing of each ATM cell. This delay allows the incoming data to be scanned for synchronisation, for example. It will be understood that the delay is directly proportional to the number of buffering elements utilised in the data bus. Accordingly adding more buffering elements 70 will increase this delay time and removing buffering elements 70 will reduce the delay.

Once one array 31 has been written fully, the write token 110 passes to the second array 32, where, after a three write delay it is placed in the uppermost group of memory cells 50'. The token 110 will arrive in the uppermost group 50' of the second array 32 in the same write cycle as the first 8 bits of the next ATM cell. After writing the second ATM cell, the write token 110 returns again to the top of the first array 31. The write token 110 is thus circulated continuously through both arrays. It should be noted that in the second array 32, the transition from one bus portion to the next occurs in the middle of a 16-bit memory cell group 50. To prevent loss of data, the 16-bit memory cell group 50 above this split group is written at the same time as the lower half of the split group as indicated by the shading in FIG. 2. In the next cycle, the upper half of the split group will be written at the same time as the 16-bit memory cell group located below the split group.

The above-described sequential flow of the write token 110 is adequate for most applications of the serial to parallel converter, however, when it is used to multiplex an asynchronous bit stream, such as in an ATM switch, it may at times be necessary to delay the movement or shift the position of the write token 110 when the switch is hunting for synchronisation data. The built-in delay between finishing writing data to one array and starting in the next allows a certain flexibility in the control of the write token 110. In particular, when searching for synchronisation information, the write controller 100 has the possibility of shortening the transfer delay for the write token 110, for example to one or two write cycles instead of three, to scan incoming data, without risk of loosing information.

Reading of parallel ATM cells out of the converter 10 is controlled by the read controller 200. Reading occurs in a similar manner to the writing of the storage elements in the sense that it too is based on a circulating token 210, which designates the group of memory cells 50, 50' that may be read. As for the write token 110, the movement of the read token 210 represents the order in which the memory cells are addressed to enable reading. This is illustrated in FIG. 4. The read token 210 is circulated in accordance with a read cycle defined by an output clock. The output clock may be generated by the read controller 200 or by a separate and not illustrated clock generator. The read token 210 marks all memory cells in one array 31, 32 of a storage element simultaneously and then moves to the next storage element 30 in the next read cycle. In the structure shown in FIG. 4, assuming the bit rates of all incoming channels are equal, eight ATM cells must be read out in parallel from the first arrays 31 of all storage elements 30 in the time it takes to write one ATM cell into the second arrays 32 of all eight storage elements 30. Accordingly, with an incoming bit rate of 10 Gbit/s and an input clock rate of 622 MHz, an output clock rate of about 188 MHz is required.

To prevent the controllers 100, 200 from accessing the read and write ports of the same memory cell groups 50, 50' simultaneously, the read controller 200 is informed by the write controller 100 of the position of the write token. Reading will commence in the array in which no write token is located. In FIG. 4, the read token marks the first arrays 31 of all storage elements 30 sequentially. Once all first arrays 31 have been read, the read token is passed from storage element 30 to storage element in the second arrays 32. Subsequent passes of the read token will alternate between the arrays 31, 32.

If the flow of the write token 110 is altered, for example when the switch is searching for synchronisation data, the read controller will be informed of the new position of the write token. However, if such a shift does occur, there is a danger that the write token 110 will move from one array 31, 32, to the top of the other before the read token 210 has completed its circulation through all the storage elements 30. Accordingly the read controller 200 may attempt to access the same group of memory cells 50, 50' as the write controller 100. Since the read cycle is equal to approximately 3.3 write cycles, this overlap could occur within five write cycles: at the end of a cycle, during three cycles and at the beginning of a cycle. The likelihood of such a conflict occurring is limited by splitting the read cycle as illustrated in FIG. 5. Specifically, the reading of the upper half of an array 31, 32 is advanced by one read cycle compared to the reading lower half of the array. This is illustrated schematically by the use of two read tokens 210' and 210", one for the upper 212 bits and the other for the lower 212 bits of the ATM cell. The upper half of the ATM cell, shown schematically in FIG. 5 by 'A' is thus read one read cycle betore the corresponding lower half of the ATM cell. After the converter 10, the ATM cell is reassembled by delaying the first half of the ATM cell by one read cycle.

The above described 'round-robin' reading scheme, wherein the token passes from one storage element 30 to an adjacent storage element every read cycle, is simple to implement, for example using a counter, and ensures that data will be read out in every read cycle. However, when the incoming channels have different bit rates, this scheme will not be effective, because all arrays 31, 32 will not be ready for reading in the allotted read cycle. In this case the input clocks associated with each storage element 30 will not be the same but will be adapted to the respective channel bit rate. The read cycle will then be adapted to the total bandwidth of the incoming data streams. For such an implementation, it will be apparent that separate write controllers 100 may be provided for each storage element 30, each controller 100 defining a write cycle adapted to the incoming bit rate. A single central read controller 200 could then be used to define the read cycle. The read controller 200 computes which of the storage elements 30 may be read from during which cycle after consultation with the various write controllers 100.

It is apparent from the above description that the write token 110 travels in the opposite direction from the data flow in the bus 60. The advantage of this configuration is that the read and write tokens 10, 210 can be reliably separated during operation. If the flow of the write token were reversed, i.e. if the write token were to travel from the bottom of an array 31, 32, to the top, the actual read cycle would be extended by the accumulated buffer delays (3 write cycles) and writing would have to occur simultaneously in both arrays during three write cycles, which renders the task of the read controller 200 considerably more complex, and in some cases impossible to implement without the loss of data. In the same way, in the split read cycle, described with reference to FIG. 5 above, the reading of the lower memory cells of each array 31, 32 would have to be delayed by two read cycles instead of one.

FIG. 6 shows the structure of a parallel to serial converter 11 according to the present invention. This converter 11 has essentially the same structure as the serial to parallel converter 10 shown in FIG. 1 with the exception that the write. ports of each group of memory cells 50, 50' in each row of the memory cells are connected in parallel, while the read ports of all memory cells 50, 50' are connected to the data bus 60. Writing and reading is controlled by controllers 400 and 300, whereby the write controller 400 of the parallel to serial controller controls access to the write ports of the memory cells in an analogous manner to that exercised by the read controller 200 over the read ports of the serial to parallel converter 10. Likewise the read controller 300 of the parallel to serial converter 11 operates in an analogous manner to the write controller 100 of the serial to parallel controller 10. As for the serial to parallel controller 10, individual read controllers 200 may be provided for each storage element 30 of the parallel to serial converter 11, whereby each read controller 200 defines a read cycle that is adapted to the required serial bit rate in the outgoing channel 20. In this arrangement, the write cycle will be equal to approximately 3.3 read cycles. Accordingly, in the parallel to serial converter 11, the write token goes from column to column and the read tokens (one for each column) moves sequentially through the columns. In an analogous fashion to the serial to parallel converter 10, the read tokens travel in the opposite direction to that of data on the data bus 60. However, to simplify control, the data bus is oriented in the opposite direction to that depicted in FIG. 2, as illustrated in FIG. 6. The cell groups 50, 50' directly adjacent a buffer 70 will be read simultaneously so that the corresponding 16 bits of data reach the adjacent data bus portion simultaneously. The buffer 70 will then delay the data on the upstream portion of data bus 60 relative to that on the downstream portion by one read cycle. The control of this arrangement is simple to implement, however, it will be understood that the structure of the converter may be made identical to that shown in FIG. 2, i.e. with data exiting via the data bus at the bottom of FIG. 6 rather than at the top. While this arrangement renders the control of the read tokens a little more complex, because an additional delay is required as the token moves across the interfaces between adjacent bus portions, it is nevertheless perfectly feasible. Moreover, this has the added advantage of rendering the floor plans of the serial to parallel and parallel to serial converter identical. To prevent conflicts between the read and write controllers 300, 400, the writing of a complete array 31, 32 may be split over at least two write cycles as described with reference to the read cycle of the serial to parallel controller 10.

In the embodiments described above, 16-bit serial channels and a corresponding 16-bit data bus 60 are used to provide a high-speed implementation. However, these performance demands add extra complexity to the structure and control of the converters, particularly for applications in which the data packet size is not a factor of 16, as for ATM. The use of 8-bit serial channels and an 8-bit data bus would clearly have simplified the writing and reading schemes in the serial to parallel converter and parallel to serial converter, respectively. It will be understood that the structure of the converters may be chosen to provide a suitable trade-off between performance and ease of control, depending on the application.

It will further be apparent that the size of the arrays need not correspond to the packet size of the protocol utilised, but may be dimensioned to hold only part of a data packet, or even several data packets. Furthermore, while in the description above, the storage elements 30 of both the serial to parallel and parallel to serial converters 10, 11 comprise only two arrays, it will be understood that three or more could be provided.

What is claimed is:

1. An apparatus for converting data between serial and parallel formats, comprising:

one or more serial data channels;

a storage element associated with each of said one or more serial data channel and having at least first and second arrays of storage cells, wherein each of said storage cells includes first and second ports, wherein the first ports of all storage cells of a storage element are connected in parallel to a data bus interconnecting the storage element with an associated channel, and wherein the data bus comprises at least one buffering element arranged to separate said data bus into portions, each of said portions being connected to the first port of at least one of said storage cells of each array of said storage element; and means for enabling data transfer between said bus and at least one of said storage cells via a corresponding one of said first ports, and for enabling data transfer from at least one of said portions to an adjacent portion via said at least one buffering element.

2. An apparatus as claimed in claim 1, wherein said means for enabling data transfer comprises first clock generating means adapted to control access to said storage cells and to control the data transfer to the adjacent portion.

3. An apparatus as claimed in claim 2, wherein said first clock generating means is adapted to a transmission speed corresponding to an associated said serial data channel.

4. An apparatus as claimed in claim 2, further comprising means for controlling access to the storage cells of one of said array simultaneously via said second ports.

5. An apparatus as claimed in claim 4, wherein said means for controlling access to the storage cells comprises a second clock generating means.

6. An apparatus as claimed in any preceding claim, wherein the first ports of the storage cells of each of said arrays are adapted to be accessed sequentially.

7. An apparatus as claimed in claim 1, wherein said buffering element includes at least one side, and for each of said arrays, the first ports of the storage cells are disposed on each side of the buffering element and are adapted to be accessed simultaneously.

8. An apparatus as claimed in claim 1, wherein said buffering element comprises a pipeline register.

9. An apparatus as claimed in claim 1, wherein the second ports of each of said storage cells are connected in parallel across all of said arrays.

10. An apparatus as claimed in claim 1, wherein said storage cells comprise dual-port random access memory (RAM) cells.

11. An apparatus as claimed in claim 1, wherein each of said arrays is adapted to store at last one data packet.

12. An apparatus as claimed in claim 1, wherein each of said arrays is adapted to store part of a data packet.

13. An apparatus as claimed in claim 1, wherein said storage cells are arranged to store more than one bit of data simultaneously.

14. An apparatus as claimed in claim 1, wherein said data is converted from a serial to parallel format and wherein said first ports are input ports and said second ports are output ports.

15. An apparatus as claimed in claim 1, wherein said data is converted from a parallel to serial format and wherein said first ports are output ports and said second ports are input ports.

16. An apparatus for converting data input through at least one channel in a serial format into a parallel format, comprising:

at least one serial data input channel;

a storage element associated with each said serial data channel and having at least first and second arrays of storage cells, wherein each of the storage cells includes an input port and an output port, such that input ports for all of the storage cells of the storage element am connected in parallel to a data bus interconnecting the storage element with an associated serial data channel, and wherein said data bus comprises at least one buffering element arranged to separate said data bus into portions, each of said portions being connected to an input port of at least one of said storage cells of each array of said storage element; and means for enabling data input from said data bus to at least one of said storage cells in said storage element and for enabling said buffering element to buffer said data onto said data bus portion in accordance with a predetermined input cycle.

17. A communications switch comprising said apparatus as claimed in any one of claims 1 or 16.

18. A method for converting serial data to a parallel format utilising an apparatus for converting data between serial and parallel formats, said apparatus comprising one or more serial data channels; a storage element associated with each of said serial data channels and having at least first and second arrays of storage cells, wherein each of said storage cells includes first and second ports, wherein the first ports of all storage cells of a storage element are connected in parallel to a data bus interconnecting the storage element with an associated channel and where the data bus comprises at least one buffering element arranged to separate said data bus into portions, each of said portions being connected to the first port of at least one of said storage cells of each array of said storage element; and means for enabling data transfer between said bus and at least one of said storage cells via a corresponding one of aid first ports, and for enabling data transfer from at least one of said portions to an adjacent portion via said at least one buffering element, said method comprising the steps of:

transmitting serial data from each of said channels onto the said data bus associated therewith, and enabling sequential input of data from the data bus into said storage cells of a corresponding one of said arrays for each of said storage elements in accordance with a write cycle.

19. A method as claimed in claim 18, further comprising the step of, simultaneous with the step of enabling sequential input of data, outputting data from the storage cells of the other of said arrays for each storage element sequentially and in accordance with a read cycle.

20. A method as claimed in claim 19, further comprising the step of splitting the outputting of data from the storage cells over at least two read cycles.

21. A method as claimed in claim 19, further comprising the step of adapting the read cycle to correspond to a total bandwidth of every said channel.

22. A method as claimed in claim 18 further comprising the step of enabling data transfer from one of said bus portions to an adjacent bus portion during each said write cycle.

23. A method as claimed in claim 22, further comprising the step of commencing the sequential input of data into each of said arrays from one of the portions arranged furthest from an associated serial data channel.

24. A method as claimed in claim 23, further comprising the step of enabling the sequential input of data to the storage cells at an end of one of said bus portions and at a begining of a next bus portion simultaneously.

25. A method as claimed in claim 18, further comprising the step of adapting the write cycle for each said storage element to be at a transmission speed of an associated serial data channel.

26. A communications switch comprising said method as claimed in claim 18.

27. An apparatus for converting data from a parallel format into a serial format, comprising:

at least one serial data output channel;

a storage element associated with each said serial data output channel and having at least first and second arrays of storage cells, each of the storage cells including an input port and an output port, such that output ports for all of the storage cells of the storage element are connected in parallel to a data bus interconnecting the storage element with an associated serial data output channel, and wherein said data bus comprises at least one buffering element arranged to separate said data bus into portions, each of said portions being connected to an output port of at least one of said storage cells of each array of said storage element; and means for enabling data output from at least one of said storage cells in said storage element onto said data bus and for enabling said buffering element to the buffer said data onto data bus portion in accordance with a predetermined output cycle.

28. A method for converting parallel data to a serial format utilizing an apparatus as claimed in any one of claims 1 or 27, said method comprising the steps of:

enabling the sequential output of data from the storage cells of one of said arrays for each storage element onto the data bus in accordance with a read cycle; and transmitting serial data from the data bus onto the serial data channel associated therewith.

29. A method as claimed in claim 28, further comprising the step of, simultaneous with the step of enabling this sequential output of data, inputting data into the memory cells of the other of said arrays for each storage element sequentially and in accordance with a write cycle.

30. A method as claimed in claim 29, further comprising the step of splitting the inputting of data into the storage cells of one array over at least two write cycles.

31. A method as claimed in claim 29, further comprising the step of adapting the write cycle to correspond to a total bandwidth of every said channel.

32. A method as claimed in claim 28, further comprising the step of enabling data transfer from one of said bus portions to an adjacent bus portion during each said write cycle.

33. A method as claimed in claim 32, further comprising the step of commencing the output of data from each of said arrays onto one of the portions arranged closest to an associated serial data channel.

34. A method as claimed in claim 33, further comprising the step of enabling the sequential output of data from the storage cells at an end of one of said bus portions and at a beginning of a next bus portion simultaneously.

35. A method as claimed in claim 28, further comprising the step of adapting the read cycle for each said storage element to be at a transmission speed of an associated serial data channel.

* * * * *